(12) United States Patent
Sasaki et al.

(10) Patent No.: US 9,343,710 B2
(45) Date of Patent: May 17, 2016

(54) METHOD OF MANUFACTURING EL DISPLAY DEVICE

(71) Applicant: PANASONIC CORPORATION, Osaka (JP)

(72) Inventors: Shigeyuki Sasaki, Hyogo (JP); Yoshiaki Kondo, Hyogo (JP); Shigeaki Ikai, Hyogo (JP)

(73) Assignee: JOLED INC, Tokyo (JP)

( * ) Notice: Subject to any disclaimer, the term of this patent is extended or adjusted under 35 U.S.C. 154(b) by 0 days.

(21) Appl. No.: 14/585,077

(22) Filed: Dec. 29, 2014

(65) Prior Publication Data

US 2015/0118769 A1  Apr. 30, 2015

Related U.S. Application Data

(63) Continuation of application No. PCT/JP2014/002159, filed on Apr. 16, 2014.

(30) Foreign Application Priority Data

Apr. 22, 2013 (JP) .................................. 2013-089024

(51) Int. Cl.
 *H01L 51/56* (2006.01)
 *G09F 9/30* (2006.01)
 *H01L 27/32* (2006.01)
 (Continued)

(52) U.S. Cl.
 CPC ............... *H01L 51/56* (2013.01); *C23C 14/566* (2013.01); *C23C 14/584* (2013.01); *G09F 9/30* (2013.01);
 (Continued)

(58) Field of Classification Search
 CPC ....................................................... H01L 51/56

USPC ........................................................... 438/23
See application file for complete search history.

(56) References Cited

U.S. PATENT DOCUMENTS

| 6,131,307 | A | 10/2000 | Komino et al. |
| 2008/0050523 | A1* | 2/2008 | Kitazoe ................. C23C 16/345 427/255.26 |
| 2010/0256809 | A1* | 10/2010 | Ashizawa ......... H01L 21/67196 700/228 |

FOREIGN PATENT DOCUMENTS

| JP | 05-217673 A | 8/1993 |
| JP | 11-110050 A | 4/1999 |

(Continued)

OTHER PUBLICATIONS

International Search Report issued in International Application No. PCT/JP2014/002159 dated Jun. 10, 2014, with English Translation.

*Primary Examiner* — Edward Wojciechowicz

(74) *Attorney, Agent, or Firm* — McDermott Will & Emery LLP

(57) ABSTRACT

A method of manufacturing an EL display device having a panel part is such that a constituent element of the panel part is formed through film formation in a vacuum atmosphere. After the constituent element of the panel part has been formed on a substrate in the vacuum atmosphere, the post-film-formation substrate is placed on standby during transporting the substrate from a place in the vacuum atmosphere to a place in an atmospheric-pressure atmosphere. The placing the substrate on standby includes a first intake period and a second intake period. During the first intake period, an intake gas is gradually introduced to change the atmosphere, from the first vacuum atmosphere to the second vacuum atmosphere that exhibits a lower degree of vacuum than that of the first vacuum atmosphere. During the second intake period, the intake gas is introduced to change the atmosphere, from the second vacuum atmosphere to the atmospheric-pressure atmosphere. The first period is set to be longer in time than the second period.

2 Claims, 4 Drawing Sheets

(51) Int. Cl.
*C23C 14/56* (2006.01)
*C23C 14/58* (2006.01)
*H01L 51/00* (2006.01)
*C23C 14/12* (2006.01)

(52) U.S. Cl.
CPC ............ *H01L 27/3244* (2013.01); *C23C 14/12* (2013.01); *H01L 51/001* (2013.01); *H01L 2227/323* (2013.01)

(56) References Cited

FOREIGN PATENT DOCUMENTS

| | | |
|---|---|---|
| JP | 2002-231783 A | 8/2002 |
| JP | 2008-240016 A | 10/2008 |
| JP | 2009-252566 A | 10/2009 |
| JP | 2011-249089 A | 12/2011 |

\* cited by examiner

METHOD OF MANUFACTURING EL DISPLAY DEVICE

RELATED APPLICATIONS

This application is a Continuation of International Application No. PCT/JP2014/002159, filed on Apr. 16, 2014, which in turn claims the benefit of Japanese Application No. 2013-089024, filed on Apr. 22, 2013 the disclosures of which Applications are incorporated by reference herein.

BACKGROUND

1. Field

The present technology disclosed herein relates to methods of manufacturing EL display devices.

2. Description of the Related Art

In recent years, next-generation display devices have been actively developed. Among others, an EL (Electroluminescence) display device receives much attention which has a driving substrate on which first electrodes, a plurality of organic layers including light emitting layers, and second electrodes are laminated in this order. The EL display device features a wide viewing angle because of being self-luminous, power saving expectable due to no need for a backlight, high responsiveness, a thin depth of the device, and the like. For this reason, introduction of the EL display device has been strongly desired into applications for large screen display devices such as television receivers.

In applications of color display, a display technology using three-color pixels, i.e. red, blue, and green colors, is most commonly employed. Besides it, aiming at improving power saving, reliability, etc., developments of other display technologies have been advanced at various manufactures, by using four-color pixels, i.e. red, blue, green, and white colors, or alternatively red, blue, green, and light-blue colors or the like.

In an organic EL light-emitting element, it is required to form, for every pixel, an organic EL light-emitting part for each of three colors of red, blue, and green, or alternatively for each of four colors of such as red, blue, green, and white.

The most common process for forming discrete organic EL parts is such that a fine-metal mask having fine holes is used to form the organic EL parts only at locations corresponding to the holes, by vapor deposition through the mask. For example, a red-color fine-metal mask is used to form the organic EL parts to emit red light by vapor deposition through it; a green-color fine-metal mask is used to form the organic EL parts to emit green light by vapor deposition through it a blue-color fine-metal mask is used to form the organic EL parts to emit blue light by vapor deposition through it. This completes the light emitting parts to emit respective red, green, and blue light.

On the other hand, it is important to develop technology of organic EL light-emitting element which allows the use of a large size substrate, aiming at manufacturing large-size organic EL light-emitting elements and at reducing costs.

Recently, much attention has been paid to the following two methods of forming organic EL light-emitting elements through the use of a large size substrate.

One is such that white-color organic EL elements are formed over the entire region of display, and color display is performed by using a four-color filter for red, green, blue, and white colors. This method is effective in forming a large screen, a high definition display, and the like.

The other, an attention-getting method of forming organic EL light-emitting elements on a large size substrate, is such that organic EL light-emitting parts are formed by a coating method. As the coating method, various processes have been examined which can be divided broadly into two categories: That is, one includes relief printing, flexographic printing, screen printing, and gravure printing, and the other includes inkjet printing (see, Japanese Patent Unexamined Publication No. 2011-249089).

SUMMARY

The present technology disclosed herein is intended to provide a method of manufacturing an EL display device having a panel part that comprises light emitting part, in which a plurality of pixels are arrayed, and a thin-film transistor array device to control light emission of the light emitting part. In the method, a constituent element of the panel part is formed through film formation in a vacuum atmosphere. After the constituent element of the panel part has been formed on a substrate through the film formation in the vacuum atmosphere, the post-film-formation substrate is placed on standby during the post-film-formation substrate is transported from a place in the vacuum atmosphere to a place in an atmospheric-pressure atmosphere. The step of placing the substrate on standby includes a first intake period and a second intake period. During the first intake period, an intake gas is gradually introduced to change the atmosphere, from the first vacuum atmosphere to the second vacuum atmosphere that exhibits a lower degree of vacuum than that of the first vacuum atmosphere. During the second intake period, the intake gas is introduced to change the atmosphere, from the second vacuum atmosphere to the atmospheric-pressure atmosphere. The first intake period is longer in time than the second intake period.

DETAILED DESCRIPTION

Hereinafter, descriptions will be made regarding a method of manufacturing an EL display device according to an embodiment of the present technology disclosed herein, with reference to FIGS. 1 to 5 of the accompanying drawings. It is noted, however, that descriptions in more detail than necessary will sometimes be omitted. For example, detailed descriptions of well-known items and duplicate descriptions of substantially the same configuration will sometimes be omitted, for the sake of brevity of the following descriptions and easy understanding by those skilled in the art.

Note that the accompanying drawings and the following descriptions are provided herein to facilitate fully understanding of the present disclosure by those skilled in the art, and are in no way intended to impose any limitation on the subject matter set forth in the appended claims.

Figure 1:
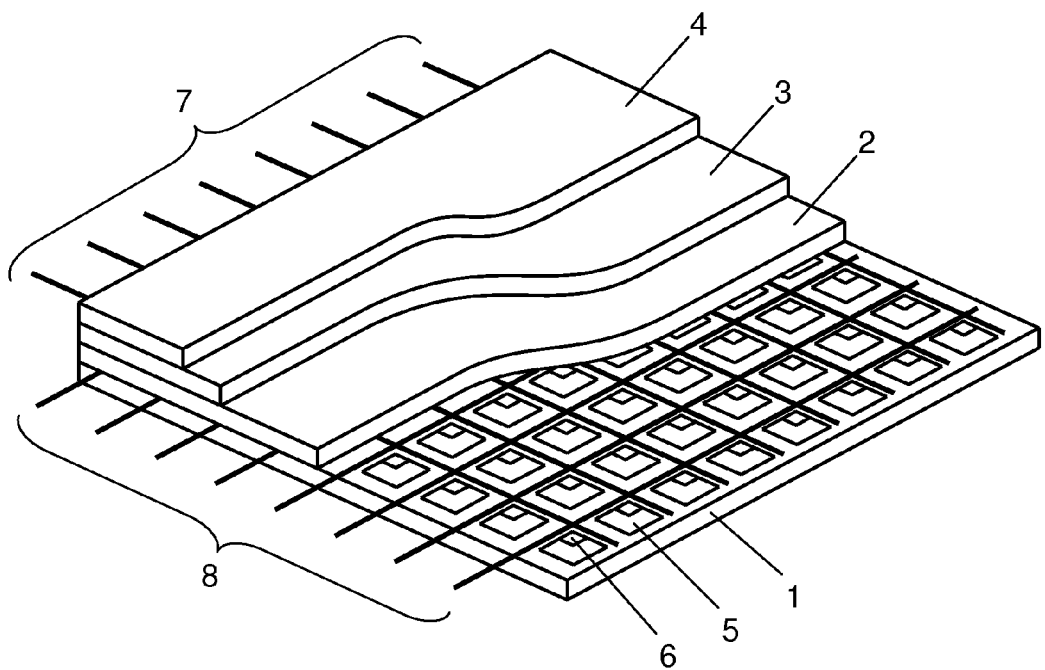
FIG. 1 is a perspective view of an organic EL display device according to an embodiment of the present technology disclosed herein.
Figure 2:
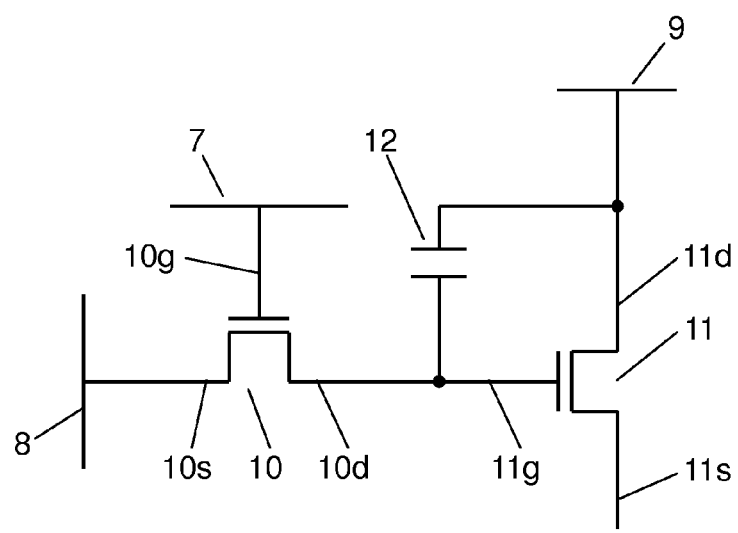
FIG. 2 is an electric circuit diagram of a circuit configuration of a pixel circuit that drives a pixel.

FIG. 1 is a schematic perspective view of a configuration of an organic EL display device according to the embodiment of the present technology disclosed herein. FIG. 2 is a view of a circuit configuration of a pixel circuit that drives a pixel.

As shown in FIGS. 1 and 2, the organic EL display device is configured having a laminated structure in which thin-film transistor array device 1 and light emitting part are laminated in this order from the lower layer. Thin-film transistor array device 1 includes a plurality of thin-film transistors. The light emitting part includes anode 2 serving as a lower electrode, light emitting layer 3 composed of an organic material, and cathode 4 serving as a transparent upper electrode. Light emission of the light emitting part is controlled by thin-film transistor array device 1. Moreover, the light emitting part has a configuration in which light emitting layer 3 is disposed between anode 2 and cathode 4 serving as a pair of electrodes. Between anode 2 and light emitting layer 3, a hole transport layer is formed by lamination. Between light emitting layer 3 and transparent cathode 4, an electron transport layer is formed by lamination. In thin-film transistor array device 1, a plurality of pixels 5 are disposed in a matrix.

Each of pixels 5 is driven by pixel circuit 6 that is disposed for the each. Moreover, thin-film transistor array device 1 includes a plurality of gate wirings 7 disposed in rows, a plurality of source wirings 8 serving as signal wirings disposed in columns to intersect with gate wirings 7, and a plurality of power supply wirings 9 (omitted in FIG. 1) extending in parallel with source wirings 8.

Gate wirings 7 connect, for every row, with gate electrodes 10g of thin-film transistors 10 which each operate as a switching element included in each of pixel circuits 6. Source wirings 8 connect, for every column, with source electrodes 10s of thin-film transistors 10 which each operate as a switching element included in each of pixel circuits 6. Power supply wirings 9 connect, for every column, with drain electrodes 11d of thin-film transistors 11 which each operate as a driving element included in each of pixel circuits 6.

As shown in FIG. 2, each of pixel circuits 6 is configured with thin-film transistor 10 operating as the switching element, thin-film transistor 11 operating as the driving element, and capacitor 12 storing data to be displayed at the corresponding pixels.

Thin-film transistor 10 is configured with gate electrode 10g connected to gate wiring 7, source electrode 10s connected to source wiring 8, drain electrode 10d connected to both capacitor 12 and gate electrode 11g of thin-film transistor 11, and a semiconductor film (not shown). Upon applying voltages to gate wiring 7 and source wiring 8 both connected to thin-film transistor 10, the transistor 10 stores, in capacitor 12, the value of the voltage applied to source wiring 8, with the value being as display data.

Thin-film transistor 11 is configured with gate electrode 11g connected to drain electrode 10d of thin-film transistor 10, drain electrode 11d connected to both power supply wiring 9 and capacitor 12, source electrode 11s connected to anode 2, and a semiconductor film (not shown). Thin-film transistor 11 supplies current corresponding to the voltage value stored in capacitor 12, to anode 2 from power supply wiring 9 via source electrode 11s. That is, the EL display device with the configuration described above employs an active matrix system in which display control is performed for every pixel 5 that is located at an intersection of gate wiring 7 and source wiring 8.

Moreover, in the EL display device, the light emitting parts that emit light of at least red, green, and blue lights are such that a plurality of sub-pixels is disposed in a matrix to form the plurality of the pixels. The sub-pixels have the respective light emitting layers to emit respective light of at least red light (R), green light (G), and blue light (B). The sub-pixels constituting each pixel are separated from each other by banks. The banks are formed in such a manner that protruded ribs extending in parallel with gate wirings 7 and protruded ribs extending in parallel with source wiring 8 are formed to intersect with each other. Then, in portions surrounded by the respective protruded ribs, i.e. in openings of the banks, the sub-pixels having the respective light emitting layers of R, G, and B are formed.

Figure 3:
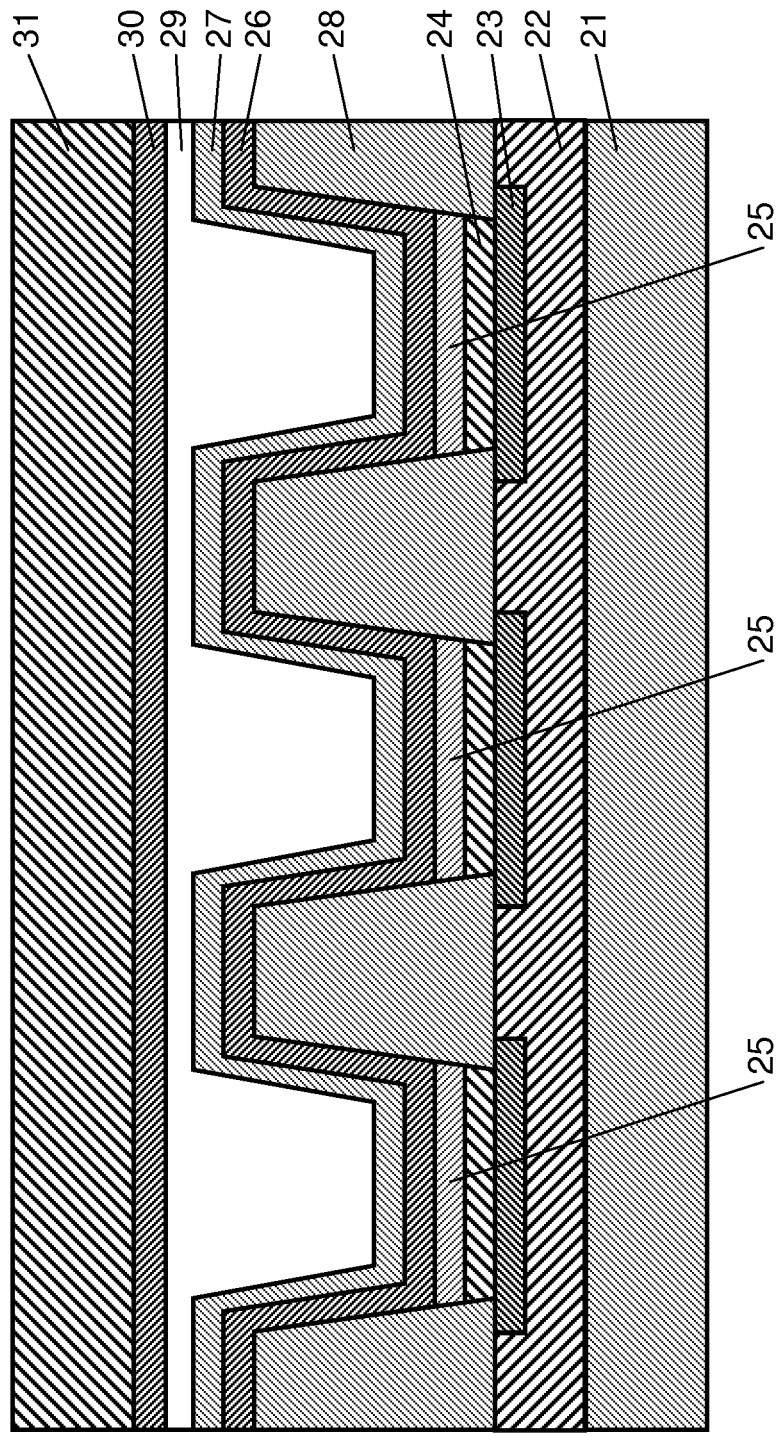
FIG. 3 is a cross-sectional view of a cross-sectional structure of sub-pixel portions of R, G, and B, in the EL display device.

FIG. 3 is a cross-sectional view of a cross-sectional structure of the sub-pixel portions of R, G, and B, in the EL display device. As shown in FIG. 3, the panel part of the EL display device is such that, on base substrate 21 such as a glass substrate or a flexible resin substrate, thin-film transistor array device 22 is formed which constitutes pixel circuits 6 described above. In addition, on thin-film transistor array device 22, anodes 23 serving as the lower electrodes are formed via a planarization insulating film (not shown). Then, on top of the anodes 23, there are laminated hole transport layer 24, light emitting layer 25 composed of the respective organic material to emit light of R, G, or B, electron transport layer 26, and cathode 27 serving as the transparent upper electrode, in this order. This constitutes the organic EL light-emitting parts of R, G, and B.

Moreover, each of light emitting layers 25 of the light emitting parts is formed in a region partitioned by banks 28 that are insulating layers. Banks 28 are intended to partition the light emitting region into predetermined shapes as well as to ensure the insulation between anodes 23 and cathodes 27. The banks are composed of a photosensitive resin including silicon oxide and polyimide, for example.

Note that, in the embodiment described above, only hole transport layers 24 and electron transport layers 26 are shown; however, in each of transport layers 24 and electron transport layers 26, a hole injection layer and an electron injection layer are formed by lamination, respectively.

The thus-configured light emitting parts are covered with sealing layer 29 made of such as silicon nitride. In addition, on top of sealing layer 29, sealing substrate 31 such as a transparent glass substrate or a transparent flexible resin substrate is bonded via bonding layer 30 over the entire sealing layer to seal the light emitting parts.

Here, for base substrate 21, its material may be appropriately selected depending on the application purpose, without particular restrictions in terms of shape, material, and size. For example, it may be a glass substrate such as a non-alkali glass or soda glass substrate, a silicon substrate, or a metal substrate. Moreover, being targeted at light weight and/or flexible performance, a polymeric material may be used for the substrate. For the polymeric material, there are suited polyethylene terephthalate, polycarbonate, polyethylenenaphthalate, polyamide, polyimide, and the like.

Other known polymeric materials for the substrate may be used including an acetate resin, an acryl resin, polyethylen, polypropylene, a polyvinylchloride resin, and the like. When the polymeric material is used for the substrate, the method of manufacturing the device is such that the polymeric material is formed by coating or bonding on a stiff substrate such as a glass one, followed by forming the organic EL light-emitting elements on the polymeric material. After that, the stiff substrate such as the glass one is removed.

Anodes 23 are configured using, such as, a metal material with high conductivity including aluminum, an aluminum alloy, and copper, or alternatively using a metal oxide or a metal sulfide which is optically transparent and highly electric-conductive, including IZO, ITO, tin oxide, indium oxide, and zinc oxide. The formation of the anodes may employ a method of forming thin films including vacuum vapor deposition, sputtering, and ion plating.

Hole transport layers 24 are configured using, such as, a polyvinyl carbazole material, a polysilane material, a polysiloxane derivative, a phthalocyanine compound including copper phthalocyanine, or an aromatic amine compound. The formation of the hole transport layers can employ various kinds of coating method. The hole transport layers are formed with a thickness of about 10 nm to 200 nm. Moreover, the hole injection layer laminated on hole transport layers 24 is one that enhances injection of holes from anode 23. The hole injection layer is formed by sputtering with a metal oxide such as molybdenum oxide, vanadium oxide, or aluminum oxide, or alternatively with a metal nitride or a metal oxynitride.

Light emitting layers 25 is configured mainly with an organic material which shows fluorescence and/or phosphorescence. When required, a dopant is added to the light emitting layers to improve characteristics of the layers. As a polymeric organic material suitable for printing, there are used a polyvinyl carbazole derivative, a poly-para-phenylene derivative, a polyfluorene derivative, a polyphenylene vinylene derivative, or the like. The dopant is used to shift wavelengths of emitted light and/or to improve light-emission efficiency. A wide range of the dopants, dye-based and metal complex-based ones, have been developed. Moreover, when light emitting layers 25 are formed on a large size substrate, printing methods are suitable for the formation thereof. Among various printing methods, an inkjet method is favorably used to form light emitting layers 25 with a thickness of about 20 nm to 200 nm.

Electron transport layers 26 are configured with a material including a benzoquinone derivative, a polyquinoline derivative, an oxadiazole derivative. The electron transport layers are formed through film formation by, such as, vacuum vapor deposition or coating application, to have a thickness of commonly about 10 nm to 200 nm. Moreover, the electron injection layers are formed, by vacuum vapor deposition or coating application, with a material including barium, phthalocyanine, and lithium fluoride.

Cathodes 27 are formed with a different material depending on the type of output direction of emitted light. For the type in which the emitted light is output from the cathode 27 side, the material is an optically-transparent and conductive material such as ITO, IZO, tin oxide, or zinc oxide. For the type in which the emitted light is output from the anode 23 side, the material is platinum, gold, silver, copper, tungsten, aluminum, an aluminum alloy, or the like. The cathodes are formed through the film formation by, such as, sputtering or vacuum vapor deposition, to have a thickness of about 50 nm to 500 nm.

Banks 28 have a structure needed for filling each region with a sufficient amount of a solution containing the material of light emitting layers 25, and are formed in a predetermined shapes by photolithography. By controlling the shapes of banks 28, it is possible to define the shapes of the sub-pixels of the organic EL light-emitting part.

Sealing layer 29 is formed by forming a film of silicon nitride, and its film formation can employ a CVD (Chemical Vapor Deposition) method.

As described above, in the EL display device, the formation of part or all of the constituent elements, such as thin-film transistor array device 22 and anodes 23 of the light emitting part, configuring the panel part employs the method of forming films by such as the vacuum vapor deposition in a vacuum atmosphere. Moreover, the method of forming films in the vacuum atmosphere includes the following step to be performed when the substrate is transported into film-forming equipment of the vacuum atmosphere, and when the post-film-formation substrate is taken out from the film-forming equipment of the vacuum atmosphere and then transported to another place in an atmospheric-pressure atmosphere. The step is such that the substrate is temporary placed on standby for a period during which the ambient atmosphere of the substrate is changed from the atmospheric-pressure atmosphere to the vacuum atmosphere, or alternatively from the vacuum atmosphere to the atmospheric-pressure atmosphere.

Figure 4:
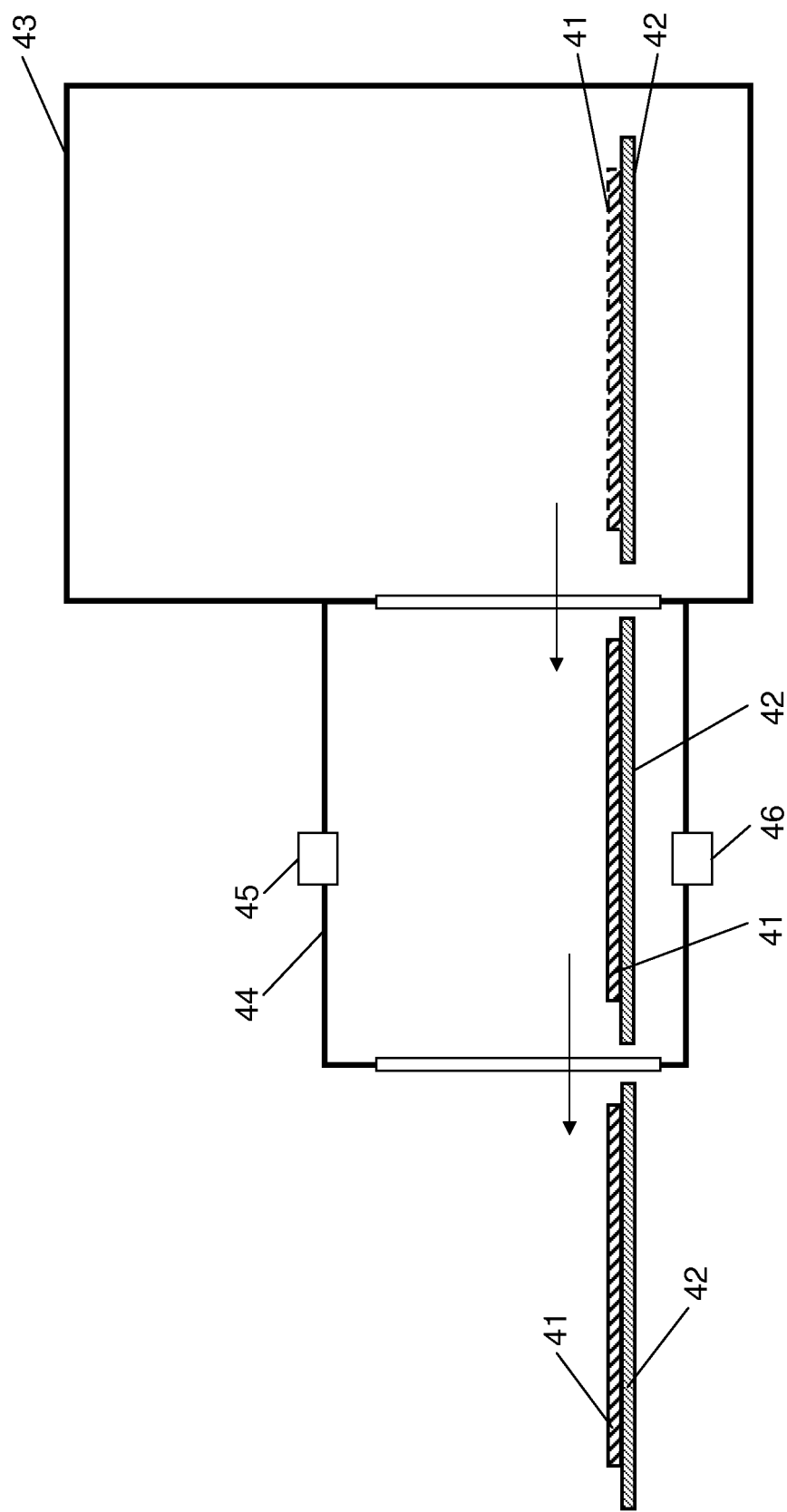
FIG. 4 is a view illustrating a step of transporting a post-film-formation substrate from a place in a vacuum atmosphere to a place in an atmospheric-pressure atmosphere, after constituent elements of a panel part have been formed through film formation in the vacuum atmosphere, in a method of manufacturing the EL display device according to the embodiment of the present technology.

FIG. 4 is a view illustrating the step of transporting the post-film-formation substrate from a place in the vacuum atmosphere to a place in the atmospheric-pressure atmosphere, after the constituent elements of panel part have been formed through the film formation in the vacuum atmosphere, in the method of manufacturing the EL display device according to the embodiment of the present technology.

As shown in FIG. 4, substrate 41 on which the constituent elements have been formed is taken out from film-forming equipment 43 of the vacuum atmosphere, with the substrate being mounted on transportation tray 42. Then, the substrate is transported into load lock chamber 44, which communicates with film-forming equipment 43, where post-film-formation substrate 41 is placed on standby. Note that film-forming equipment 43 preforms the film formation of the vacuum atmosphere with a pressure (degree of vacuum) of commonly $10^{-2}$ Pa to $10^{-4}$ Pa.

In the step of placing post-film-formation substrate 41 on standby in load lock chamber 44, a dry gas serving as an intake gas is introduced into the chamber from intake line 45 disposed in the upper part, thereby changing the atmosphere from the vacuum atmosphere with a high degree of vacuum of $10^{-2}$ Pa to $10^{-4}$ Pa to the atmospheric-pressure atmosphere. After the atmosphere of load lock chamber 44 have reached the atmospheric-pressure atmosphere, post-film-formation substrate 41 is taken out from load lock chamber 44, with the substrate being mounted on transportation tray 42, and is transported for the next step. Note that, in the lower part of load lock chamber 44, exhaust line 46 is disposed such that the degree of vacuum of the load lock chamber 44 can be adjusted by controlling the exhaust of the dry gas from exhaust line 46 in the lower part, as well as controlling the intake of the dry gas from intake line 45 in the upper part.

Figure 5:
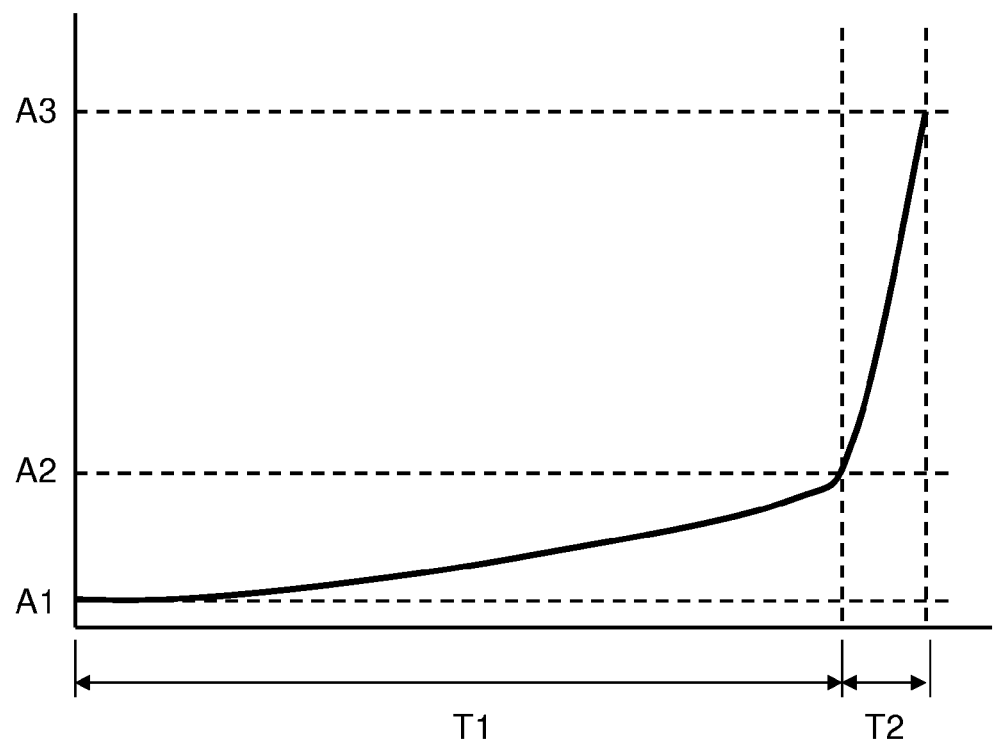
FIG. 5 is a graph showing variations in pressure during a step in which the post-film-formation substrate is placed on standby in a load lock chamber, in the method of manufacturing the EL display device according to the embodiment of the present technology.

FIG. 5 is a graph showing variations in pressure during the step in which the post-film-formation substrate is placed on standby in the load lock chamber, in the method of manufacturing the EL display device according to the embodiment of the present technology.

As shown in FIG. 5, the step of placing the post-film-formation substrate on standby includes first intake period T1 and second intake period T2. During first intake period T1, the intake gas is gradually introduced into the atmosphere to change it, from a first vacuum atmosphere with high degree A1 of vacuum to a second vacuum atmosphere with lower degree A2 of vacuum than degree A1 of the first vacuum atmosphere. During second intake period T2, the intake gas is introduced into the atmosphere to change it, from the second vacuum atmosphere with lower degree A2 of vacuum to the atmospheric-pressure A3 atmosphere. Moreover, first intake period T1 is set to be longer in time than second intake period T2. That is, during first intake period T1, the degree of vacuum of the atmosphere is gradually decreased from the high degree, along a gentle curve. On the other hand, during second intake period T2, the atmosphere reaches to the atmospheric pressure, along a steep curve.

This configuration is based on the fact, which is made clear, that it is possible to prevent adhesion of water and the like onto post-film-formation substrate 41, by adopting the combination of first intake period T1 of introducing the gas until the predetermined degree of vacuum along the gentle curve and second intake period T2 of introducing the gas up to the atmospheric pressure along the steep curve, as just described.

In this way, in accordance with the technology disclosed herein, the step of placing the post-film-formation substrate on standby includes first intake period T1 and second intake period T2. During first intake period T1, the intake gas is gradually introduced to change the atmosphere from the first vacuum atmosphere to the second vacuum atmosphere that is lower in degree of vacuum than the first vacuum atmosphere. During second intake period T2, the intake gas is introduced to change the atmosphere from the second vacuum atmosphere to the atmospheric-pressure atmosphere. In addition, the first intake period T1 is set to be longer in time than second intake period T2. This configuration allows the prevention of the adhesion of water and the like onto post-film-formation substrate 41. This makes it possible to reduce defect rates of products in manufacturing the EL display devices, leading to increased yields in the manufacture.

Note that, in the embodiments described above, although the descriptions have been made using the top-emission type device which has the structure easy to realize higher definition, the present technology disclosed herein is also effective for a bottom-emission type structure.

As described above, the aforementioned embodiments have been described for exemplifying the technology according to the present disclosure. However, the present technology disclosed herein is not limited to the embodiments, and may be applied to other embodiments which have been subjected to changes and modifications, replacements, additions, omissions, or the like.

As described above, the technology according to the present disclosure is effective for increasing yields in manufacturing the EL display devices.

What is claimed is:

1. A method of manufacturing an EL display device having a panel part, the panel part comprising: a light emitting part in which a plurality of pixels are arrayed; and a thin-film transistor array device to control light emission of the light emitting part, the method comprising the steps of:
    forming a constituent element of the panel part on a substrate, through film formation in a vacuum atmosphere; and
    placing the post-film-formation substrate on standby in a load lock chamber, after the step of forming the constituent element, during transporting the post-film-formation substrate from a place in the vacuum atmosphere to a place in an atmospheric-pressure atmosphere,
    wherein the step of placing the post-film-formation substrate on standby includes a first intake period and a second intake period, the first intake period being longer in time than the second intake period, the first intake period being for gradually introducing an intake gas to change a first vacuum atmosphere into a second vacuum atmosphere lower in degree of vacuum than the first vacuum atmosphere, the second intake period being for introducing the intake gas to change the second vacuum atmosphere into the atmospheric-pressure atmosphere; and
    a rate of change of pressure in the load lock chamber during the first intake period is less than the rate of change of pressure in the load lock chamber during the second intake period.

2. The method of manufacturing the EL display device according to claim 1,
    wherein the step of forming the constituent element configuring the panel part, through the film formation in the vacuum atmosphere, is performed in film-forming equipment;
    the step of placing the post-film-formation substrate on standby is performed in the load lock chamber communicating with the film-forming equipment; and
    the step of placing the post-film-formation substrate on standby includes the steps of:
        introducing a dry gas from an intake line disposed in an upper part of the load lock chamber; and
        exhausting the dry gas from an exhaust line disposed in a lower part of the load lock chamber.

* * * * *